United States Patent
Takamine

(10) Patent No.: US 11,218,134 B2
(45) Date of Patent: Jan. 4, 2022

(54) ACOUSTIC WAVE FILTER DEVICE AND COMPOSITE FILTER DEVICE

(71) Applicant: Murata Manufacturing Co., Ltd., Nagaokakyo (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 32 days.

(21) Appl. No.: 16/801,372

(22) Filed: Feb. 26, 2020

(65) Prior Publication Data
US 2020/0195227 A1 Jun. 18, 2020

Related U.S. Application Data

(63) Continuation of application No. PCT/JP2018/032601, filed on Sep. 3, 2018.

(30) Foreign Application Priority Data

Sep. 7, 2017 (JP) .............................. JP2017-171891

(51) Int. Cl.
*H03H 9/64* (2006.01)
*H03H 9/02* (2006.01)
(Continued)

(52) U.S. Cl.
CPC ...... *H03H 9/6483* (2013.01); *H03H 9/02125* (2013.01); *H03H 9/13* (2013.01);
(Continued)

(58) Field of Classification Search
CPC ............ H03H 9/605; H03H 9/13; H03H 9/17; H03H 9/70; H03H 9/02125;
(Continued)

(56) References Cited

U.S. PATENT DOCUMENTS

2003/0214369 A1* 11/2003 Kearns ................. H03H 9/6436
  333/133
2009/0201102 A1* 8/2009 Oda .................... H03H 9/02834
  333/193

(Continued)

FOREIGN PATENT DOCUMENTS

| JP | 2015-041680 A | 3/2015 |
| JP | 2016-208367 A | 12/2016 |
| WO | 2012/086639 A1 | 6/2012 |
| WO | 2016/117676 A1 | 7/2016 |

(Continued)

OTHER PUBLICATIONS

Official Communication issued in International Patent Application No. PCT/JP2018/032601, dated Oct. 9, 2018.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An acoustic wave filter device includes a plurality of acoustic wave resonators. Each of the acoustic wave resonators includes a piezoelectric layer and an IDT electrode provided on the piezoelectric layer. On a surface opposite to a surface of the piezoelectric layer on which the IDT electrode is provided, a low-acoustic-velocity film and a substrate made of a semiconductor are stacked. A routing line electrically connected to an antenna terminal is provided on an insulating film provided on the piezoelectric layer.

19 Claims, 6 Drawing Sheets

(51) Int. Cl.
  *H03H 9/13* (2006.01)
  *H03H 9/17* (2006.01)
  *H03H 9/60* (2006.01)
  *H03H 9/70* (2006.01)

(52) U.S. Cl.
  CPC .............. *H03H 9/17* (2013.01); *H03H 9/605* (2013.01); *H03H 9/70* (2013.01)

(58) Field of Classification Search
  CPC ........... H03H 9/02952; H03H 9/02574; H03H 9/568; H03H 9/542; H03H 9/706; H03H 9/725; H03H 9/6483
  USPC .......................................... 333/133, 193–196
  See application file for complete search history.

(56) References Cited

U.S. PATENT DOCUMENTS

| | | |
|---|---|---|
| 2013/0285768 A1 | 10/2013 | Watanabe et al. |
| 2014/0062614 A1* | 3/2014 | Park .................. H04B 1/006 333/133 |
| 2017/0294896 A1 | 10/2017 | Nosaka |
| 2018/0159497 A1 | 6/2018 | Iwamoto et al. |
| 2018/0248537 A1 | 8/2018 | Muranaka |

FOREIGN PATENT DOCUMENTS

| | | |
|---|---|---|
| WO | 2017/043427 A1 | 3/2017 |
| WO | 2017/085976 A1 | 5/2017 |

\* cited by examiner

ACOUSTIC WAVE FILTER DEVICE AND COMPOSITE FILTER DEVICE

CROSS REFERENCE TO RELATED APPLICATIONS

This application claims the benefit of priority to Japanese Patent Application No. 2017-171891 filed on Sep. 7, 2017 and is a Continuation Application of PCT Application No. PCT/JP2018/032601 filed on Sep. 3, 2018. The entire contents of each application are hereby incorporated herein by reference.

BACKGROUND OF THE INVENTION

1. Field of the Invention

The present invention relates to an acoustic wave filter device having a structure in which a substrate made of a semiconductor and a piezoelectric layer are stacked with a layer of another material located therebetween, and a composite filter device.

2. Description of the Related Art

In an RF stage of a smartphone, a composite filter device, such as a multiplexer, is used to support multiple bands. For example, in a multiplexer disclosed in WO 2016/117676 A1 described below, first to third acoustic wave filters are connected to an antenna terminal. The first acoustic wave filter has a pass band of a low-band cellular band. Furthermore, the second acoustic wave filter has a pass band including GPS and GLONASS bands. The third acoustic wave filter has a pass band of a middle-band cellular band.

Meanwhile, WO 2012/086639 A1 described below discloses an elastic wave device including a supporting substrate made of Si. On the supporting substrate made of Si, a low-acoustic-velocity film, a piezoelectric layer, and an IDT (interdigital transducer) electrode are stacked in this order from the bottom. A material of the supporting substrate made of Si is a high-acoustic-velocity material, and thus an elastic wave is effectively confined within the piezoelectric layer by a laminated structure including the supporting substrate made of Si and the low-acoustic-velocity film.

As disclosed in WO 2016/117676 A1, in the case of the multiplexer including a plurality of filters sharing a common connection, distortion caused by simultaneously transmitting a plurality of signals often becomes an issue. For example, when a Band 7 Tx signal is transmitted from the third acoustic wave filter, second-order intermodulation distortion in a frequency band coincident with a frequency band of a Band 7 Rx occurs from the antenna terminal due to a signal in a 5 GHz WiFi band leaking from another circuit in the same smartphone and the Band 7 Tx signal. For this reason, there is a possibility that reception sensitivity in the Band 7 Rx may decrease. Thus, a composite filter device, such as a multiplexer, is demanded that is superior to an existing band pass filter in linearity.

Meanwhile, the inventor of preferred embodiments of the present application has discovered that the structure disclosed in WO 2012/086639 A1 in which the low-acoustic-velocity film is disposed on the supporting substrate made of Si does not provide sufficient linearity. For this reason, when an acoustic wave filter having such a structure is used for a composite filter device, such as a multiplexer, the occurrence of distortion in a reception signal or the like, in particular, becomes an issue.

SUMMARY OF THE INVENTION

Preferred embodiments of the present invention provide acoustic wave filter devices that each have a structure in which a substrate including a semiconductor and a piezoelectric layer are stacked with a layer of another material located therebetween and that each have excellent linearity.

Preferred embodiments of present invention also provide composite filter devices that each include an acoustic wave filter device according to a preferred embodiment of the present invention and in each of which there is little distortion in a signal.

A preferred embodiment of the present invention provides an acoustic wave filter device including an antenna terminal electrically connected to an antenna; an input or output terminal; and an acoustic wave filter electrically connected between the antenna terminal and the input or output terminal and including a plurality of acoustic wave resonators. The plurality of acoustic wave resonators include a piezoelectric layer, an IDT (interdigital transducer) electrode provided on the piezoelectric layer, a low-acoustic-velocity film in which an acoustic velocity of a bulk wave propagating through the low-acoustic-velocity film is lower than an acoustic velocity of an acoustic wave propagating through the piezoelectric layer, and a substrate in which an acoustic velocity of a bulk wave propagating through the substrate is higher than an acoustic velocity of an acoustic wave propagating through the piezoelectric layer and that includes a semiconductor. The piezoelectric layer is provided on the substrate with the low-acoustic-velocity film located between the piezoelectric layer and the substrate, and, above the piezoelectric layer, a routing line electrically connected to the antenna terminal is provided on an insulating film provided on the piezoelectric layer.

Another preferred embodiment of the present invention provides an acoustic wave filter device including an antenna terminal electrically connected to an antenna; an input or output terminal; and an acoustic wave filter electrically connected between the antenna terminal and the input or output terminal and including a plurality of acoustic wave resonators. The plurality of acoustic wave resonators include a substrate including a semiconductor, a piezoelectric layer provided on the substrate including the semiconductor and including first and second major surfaces facing each other, a first electrode provided on the first major surface of the piezoelectric layer, and a second electrode provided on the second major surface of the piezoelectric layer and facing the first electrode with the piezoelectric layer interposed between the second electrode and the first electrode. The acoustic wave filter device further includes an insulating film provided on the piezoelectric layer, and a routing line provided on the insulating film and electrically connected to the antenna terminal.

In an acoustic wave filter device according to a preferred embodiment of present invention, the substrate is a silicon substrate.

In an acoustic wave filter device according to a preferred embodiment of present invention, the insulating film includes a synthetic resin.

In an acoustic wave filter device according to a preferred embodiment of present invention, the insulating film includes an inorganic insulating material.

A composite filter device according to a preferred embodiment of present invention includes an acoustic wave filter device according to a preferred embodiment of present invention, and at least one other acoustic wave filter device sharing a common electrical connection to the antenna terminal.

A composite filter device according to a preferred embodiment of present invention may be a multiplexer.

Furthermore, a composite filter device according to a preferred embodiment of present invention may include a plurality of acoustic wave filter devices that share a common electrical connection to the antenna terminal through a switch and in which at least one acoustic wave filter device of the plurality of acoustic wave filter devices is an acoustic wave filter device according to a preferred embodiment of present invention.

In the acoustic wave filter devices according to the preferred embodiments of present invention, linearity is improved. Thus, in the composite filter devices according to the preferred embodiments of present invention, distortion in a signal is reduced.

The above and other elements, features, steps, characteristics and advantages of the preferred embodiments of present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings to clarify the present invention.

It is noted that preferred embodiments described in the present description are illustrative, and features can be partially replaced or combined with each other between different preferred embodiments.

Figure 1:
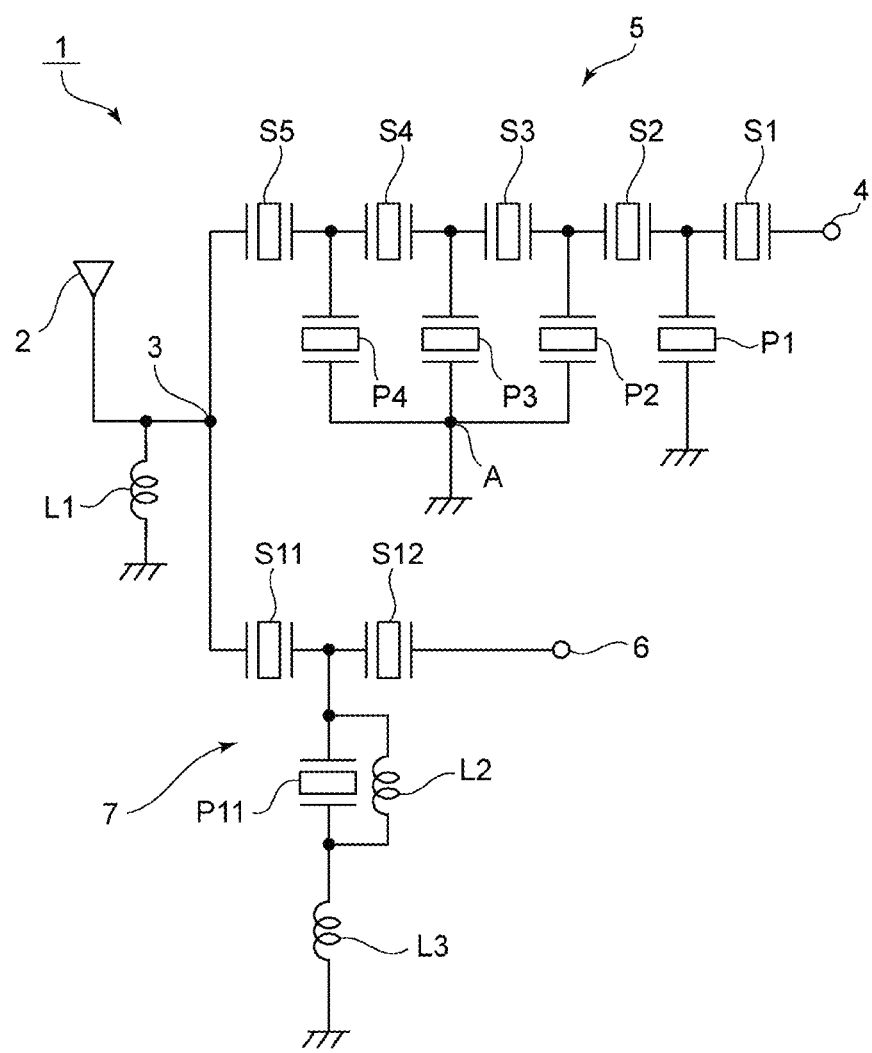
FIG. 1 is a circuit diagram of a multiplexer defining and functioning as a composite filter device according to a first preferred embodiment of the present invention.

FIG. 1 is a circuit diagram of a multiplexer defining and functioning as a composite filter device according to a first preferred embodiment of the present invention. A multiplexer 1 includes an antenna terminal 3 electrically connected to an antenna 2. One ends of a first acoustic wave filter 5 and a second acoustic wave filter 7 share a common electrical connection to the antenna terminal 3. An inductor L1 is electrically connected between the antenna terminal 3 and a ground potential. The inductor L1 is provided to achieve impedance matching.

The one ends of the first acoustic wave filter 5 and the second acoustic wave filter 7 share the common electrical connection to the antenna terminal 3.

The first acoustic wave filter 5 is a filter that passes a WiFi band, and a pass band thereof ranges from about 2401 MHz to about 2483 MHz, for example. The first acoustic wave filter 5 includes an input-output terminal 4. Series-arm resonators S1 to S5 are provided in a series arm electrically connecting the input-output terminal 4 and the antenna terminal 3. Furthermore, a parallel-arm resonator P1 is electrically connected between a connection point between the series-arm resonator S1 and the series-arm resonator S2 and the ground potential. A parallel-arm resonator P2 is electrically connected between a connection point between the series-arm resonator S2 and the series-arm resonator S3 and the ground potential. A parallel-arm resonator P3 is electrically connected between a connection point between the series-arm resonator S3 and the series-arm resonator S4 and the ground potential. A parallel-arm resonator P4 is electrically connected between a connection point between the series-arm resonator S4 and the series-arm resonator S5 and the ground potential. End portions on a ground potential side of the parallel-arm resonators P2 to P4 share a common connection at a common connection point A and are electrically connected to the ground potential. The first acoustic wave filter 5 is a ladder filter having the above-described circuitry, for example.

Each of the above-described series-arm resonators S1 to S5 and parallel-arm resonators P1 to P4 is defined by an acoustic wave resonator.

On the other hand, the second acoustic wave filter 7 is a notch filter that passes middle-band and high-band cellular bands and attenuates the WiFi band, and pass bands thereof range from about 1710 MHz to about 2200 MHz and from about 2496 MHz to about 2690 MHz, for example. The second acoustic wave filter 7 is electrically connected between the antenna terminal 3 and an output terminal 6. The second acoustic wave filter 7 includes series-arm resonators S11 and S12. A parallel-arm resonator P11 is electrically connected between a connection point between the series-arm resonator S11 and the series-arm resonator S12 and the ground potential. An inductor L2 is electrically connected in parallel with the parallel-arm resonator P11. Furthermore, an inductor L3 is electrically connected between an end portion on a ground potential side of the parallel-arm resonator P11 and the ground potential.

The series-arm resonators S11 and S12 and the parallel-arm resonator P11 are defined by an acoustic wave resonator.

Figure 2:
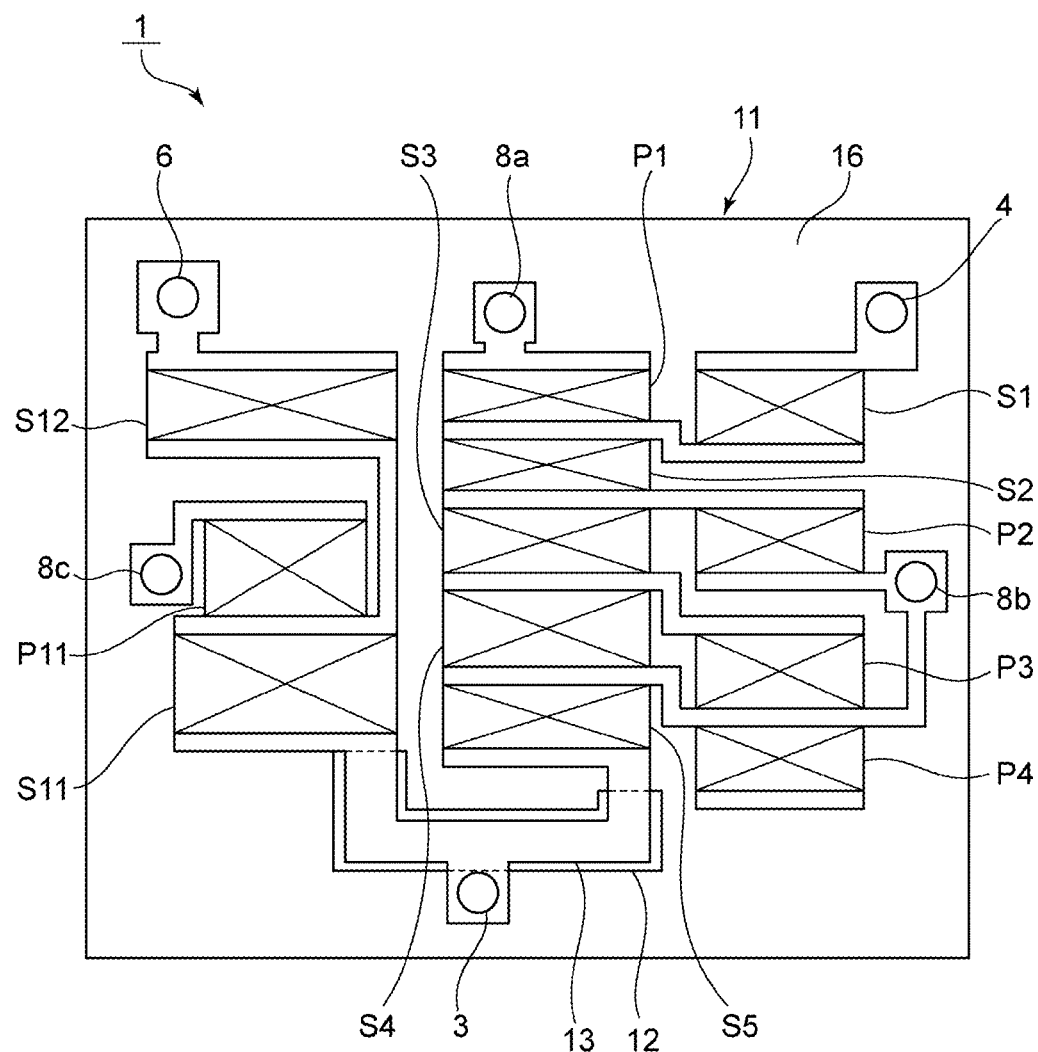
FIG. 2 is a plan view showing an electrode structure of the multiplexer according to the first preferred embodiment of the present invention.

FIG. 2 is a plan view showing an electrode structure of the multiplexer 1. The multiplexer 1 includes an acoustic wave substrate 11. The acoustic wave substrate 11 includes a piezoelectric layer 16. On the piezoelectric layer 16, an electrode structure shown in FIG. 2 is provided. In FIG. 2, each of regions where the series-arm resonators S1 to S5, the parallel-arm resonators P1 to P4, the series-arm resonators S11 and S12, and the parallel-arm resonator P11 are provided is represented by the shape of a rectangular bounding box drawn around X.

Furthermore, in each of portions where the input-output terminal 4, the output terminal 6, and the antenna terminal 3 are provided, a bump represented by a circle is provided on an electrode pad. FIG. 2 also shows ground terminals 8a to 8c electrically connected to the ground potential.

In the multiplexer 1, a routing line 13 electrically connects the series-arm resonator S11 and the series-arm resonator S5 to the antenna terminal 3. A feature of the first preferred embodiment is that an insulating film 12 is provided between the routing line 13 and the piezoelectric layer 16.

Figure 4:
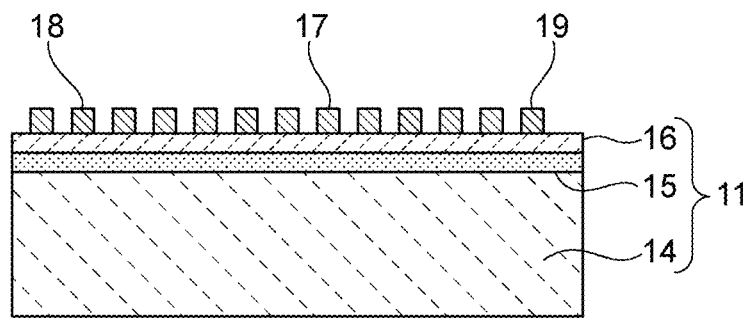
FIG. 4 is a front cross-sectional view of an acoustic wave resonator section included in the multiplexer according to the first preferred embodiment of the present invention.

FIG. 4 is a front cross-sectional view showing a structure of an acoustic wave resonator defining the series-arm resonator S5. In this acoustic wave resonator, the acoustic wave substrate 11 includes a substrate 14 including a Si semiconductor, for example, a low-acoustic-velocity film 15 provided on the substrate 14, and the piezoelectric layer 16 provided on the low-acoustic-velocity film 15.

The piezoelectric layer 16 preferably includes LiTaO₃ with cut-angle of about 50°, for example. In the preferred embodiments of the present invention, however, the piezoelectric layer 16 is not limited to this, and, for example, LiTaO₃ with other cut-angles may be used. Furthermore, another piezoelectric single crystal, for example, LiNbO₃, may be used.

An acoustic velocity of a bulk wave propagating through the low-acoustic-velocity film 15 is lower than an acoustic velocity of an acoustic wave propagating through the piezoelectric layer 16. The low-acoustic-velocity film 15 is made of an appropriate material that satisfies this acoustic velocity relationship. In the first preferred embodiment, the low-acoustic-velocity film 15 is preferably made of silicon oxide, for example.

An intermediate layer including, for example, titanium or nickel may be provided between the piezoelectric layer 16 and the low-acoustic-velocity film 15. A close contact layer including, for example, titanium or nickel may be provided between the low-acoustic-velocity film 15 and the substrate 14. Furthermore, the low-acoustic-velocity film 15 may have a multilayer structure including a plurality of layers of a material that satisfies the above-described acoustic velocity relationship. A junction layer including, for example, titanium or nickel may be included between the plurality of layers.

The substrate 14 is preferably made of a Si semiconductor as described above. An acoustic velocity of a bulk wave propagating through the substrate 14 is higher than an acoustic velocity of an acoustic wave propagating through the piezoelectric layer 16. On the substrate 14 including such a high-acoustic-velocity material, the low-acoustic-velocity film 15 is provided, and the piezoelectric layer 16 is further provided on the low-acoustic-velocity film 15. Thus, an acoustic wave can be effectively confined within the piezoelectric layer 16.

On the piezoelectric layer 16, an IDT electrode 17 and reflectors 18 and 19 located on both sides in an acoustic wave propagation direction of the IDT electrode 17 are provided. Thus, a one-port acoustic wave resonator is provided.

The IDT electrode 17 and reflectors 18 and 19 are preferably made of an appropriate metal or alloy. Furthermore, the IDT electrode 17 and the reflectors 18 and 19 may be defined by a laminated metal film.

Incidentally, although the structure of the series-arm resonator S5 has been described, the series-arm resonators S1 to S4, the parallel-arm resonators P1 to P4, the series-arm resonators S11 and S12, and the parallel-arm resonator P11 also have the same or substantially the same structure.

In the multiplexer 1 according to the first preferred embodiment, the insulating film 12 is provided between the routing line 13 electrically connecting the first and second acoustic wave filters 5 and 7 to the antenna terminal 3 and the piezoelectric layer 16. Accordingly, linearity in the first and second acoustic wave filters 5 and 7 is improved, and distortion in signals transmitted and received by the multiplexer 1 can be reduced. This will be more specifically described by providing a specific example and a comparative example.

An example of the multiplexer 1 is produced as described below. The following Table 1 shows design parameters of the first acoustic wave filter 5.

TABLE 1

|  |  | S1 | P1 | S2 | P2 | S3 | P3 | S4 | P4 | S5 |
|---|---|---|---|---|---|---|---|---|---|---|
| IDT Wavelength | (µm) | 1.5610 | 1.6160 | 1.5380 | 1.6280 | 1.5690 | 1.6210 | 1.5440 | 1.6060 | 1.5510 |
| Wavelength of Reflector | (µm) | Same as IDT | Same as IDT | Same as IDT | Same as IDT | Same as IDT | Same as IDT | Same as IDT | Same as IDT | Same as IDT |
| Intersecting Width | (µm) | 20.8 | 26.1 | 22.9 | 20.1 | 21.1 | 22.1 | 20.9 | 22.3 | 16.3 |
| Number of Pairs in IDT |  | 190 | 210 | 176 | 120 | 237 | 150 | 237 | 180 | 200 |
| Number of Electrode Fingers in Reflector |  | 21 | 21 | 21 | 21 | 21 | 21 | 21 | 21 | 21 |
| Duty Ratio |  | 0.5 | 0.5 | 0.5 | 0.5 | 0.5 | 0.5 | 0.5 | 0.5 | 0.5 |
| Number of Resonators (IDTs) connected in Series |  | 2 | No Division | 2 | 3 | No Division | No Division | No Division | No Division | 4 |

The following Table 2 shows design parameters of the second acoustic wave filter 7.

TABLE 2

|  |  | S11 | P11 | S12 |
|---|---|---|---|---|
| IDT Wavelength | (µm) | 1.631 | 1.575 | 1.602 |
| Wavelength of Reflector | (µm) | Same as IDT | Same as IDT | Same as IDT |
| Intersecting Width | (µm) | 34.9 | 21.7 | 39.1 |
| Number of Pairs in IDT |  | 210 | 170 | 230 |

TABLE 2-continued

|  | S11 | P11 | S12 |
|---|---|---|---|
| Number of Electrode Fingers in Reflector | 11 | 11 | 11 |
| Duty Ratio | 0.5 | 0.5 | 0.5 |
| Number of Divided Resonators(IDTs) connected in Series | 2 | 4 | No Division |

A thickness of the substrate 14 including a Si semiconductor is about 200 μm. As the low-acoustic-velocity film 15, a $SiO_2$ film with a thickness of about 670 nm is provided. As the piezoelectric layer 16, a $LiTaO_3$ film with a thickness of about 600 nm and cut-angles of about 50° is provided. The IDT electrode 17 and the reflectors 18 and 19 are defined by a laminated metal film provided by laminating an AlCu alloy film on a Ti film. A thickness of the Ti film is about 12 nm. With respect to the AlCu alloy film, an AlCu alloy with about 1 weight % Cu is included, and a thickness of the AlCu alloy film is about 162 nm. Furthermore, as a protective film, although not shown in FIG. 4, a $SiO_2$ film with a thickness of about 25 nm covers the IDT electrode 17 and the reflectors 18 and 19.

The second acoustic wave filter 7 is an LC filter that uses inductances of the inductors L2 and L3 and capacitances of the series-arm resonators S11 and S12 and the parallel-arm resonator P11 that are defined by an acoustic wave resonator. Here, a notch filter is provided in which attenuation in the WiFi band is increased by using a Q value of the acoustic wave resonator.

The above-described routing line 13 is also defined by the same or similar laminated metal film as the IDT electrode. On the other hand, as the insulating film 12, a $SiO_2$ film with a thickness of about 2 μm is included.

For comparison, a multiplexer in a comparative example is prepared that is the same or substantially the same as that in the above-described example, except that the insulating film 12 is not provided.

When a Band 7 Tx signal is transmitted, a second harmonic wave, that is, second-order intermodulation distortion is caused by a signal in a 5 GHz WiFi band and the Band 7 Tx signal. When a portion of this harmonic wave overlaps a frequency band of a Band 7 Rx, the portion of harmonic wave passes through the second acoustic wave filter 7. Accordingly, reception sensitivity in the Band 7 Rx decreases.

Figure 3:
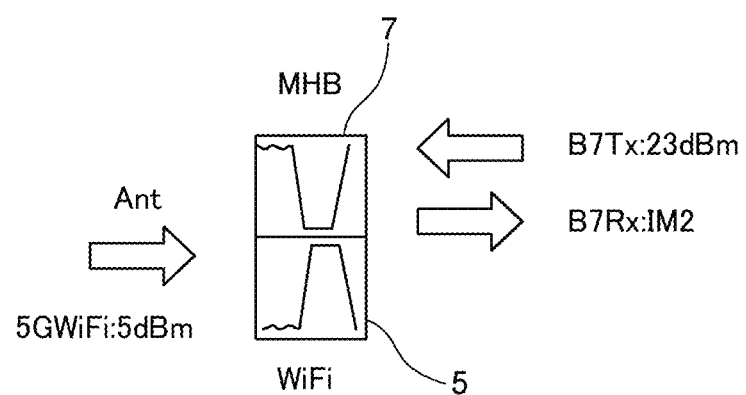
FIG. 3 is a diagram showing transmission and reception forms of signals in multiple Bands in the multiplexer according to the first preferred embodiment of the present invention.

In the multiplexers in the example and the comparative example, characteristics of second-order intermodulation distortion (IM2) are measured. Specifically, as illustrated in FIG. 3, a Band 7 Tx signal (B7Tx) of about 23 dBm is input from the second acoustic wave filter 7, and a 5 GHz WiFi signal of about 5 dBm is input from the antenna terminal. In this case, second-order intermodulation distortion (IM2) in the Band 7 Rx band (about 2620 MHz to about 2690 MHz) output at the output terminal of the second acoustic wave filter 7 is measured.

Figure 6:
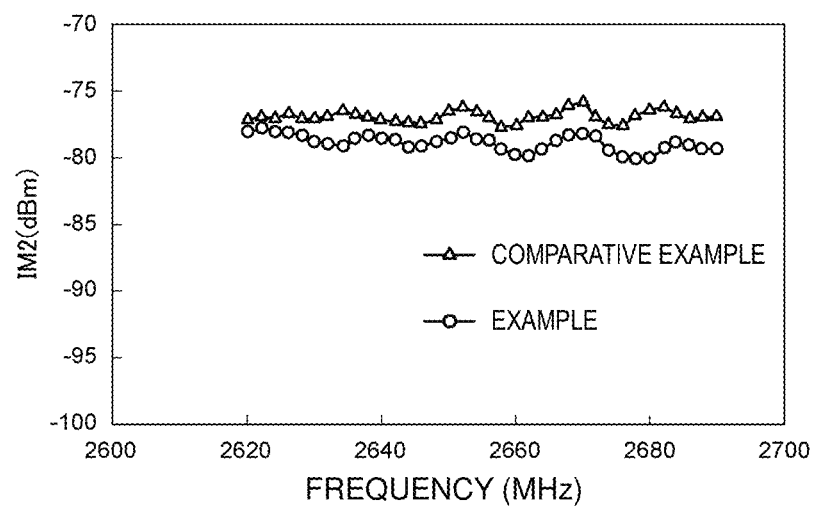
FIG. 6 shows distortion characteristics in an example and a comparative example in the first preferred embodiment of the present invention.

FIG. 6 illustrates results.

As is apparent in FIG. 6, in the example, the second-order intermodulation distortion (IM2) in the frequency band of the Band 7 Rx band is improved by about 3 dBm in comparison with that in the comparative example. A reason why the second-order intermodulation distortion (IM2) decreases as described above is considered as follows.

Specifically, in the structure in which the low-acoustic-velocity film 15 and the piezoelectric layer 16 are stacked on the substrate 14 including a Si semiconductor, a carrier, for example, an electron or positive hole, is generated at an interface between the substrate 14 and the low-acoustic-velocity film 15 by external influences, for example, heat and potential. When the carrier is generated, an interface portion where the carrier is generated behaves like a conductive layer. Accordingly, electrostatic capacitance is generated between the IDT electrode 17 or routing line 13 and the conductive layer, thus deteriorating linearity.

Figure 5:
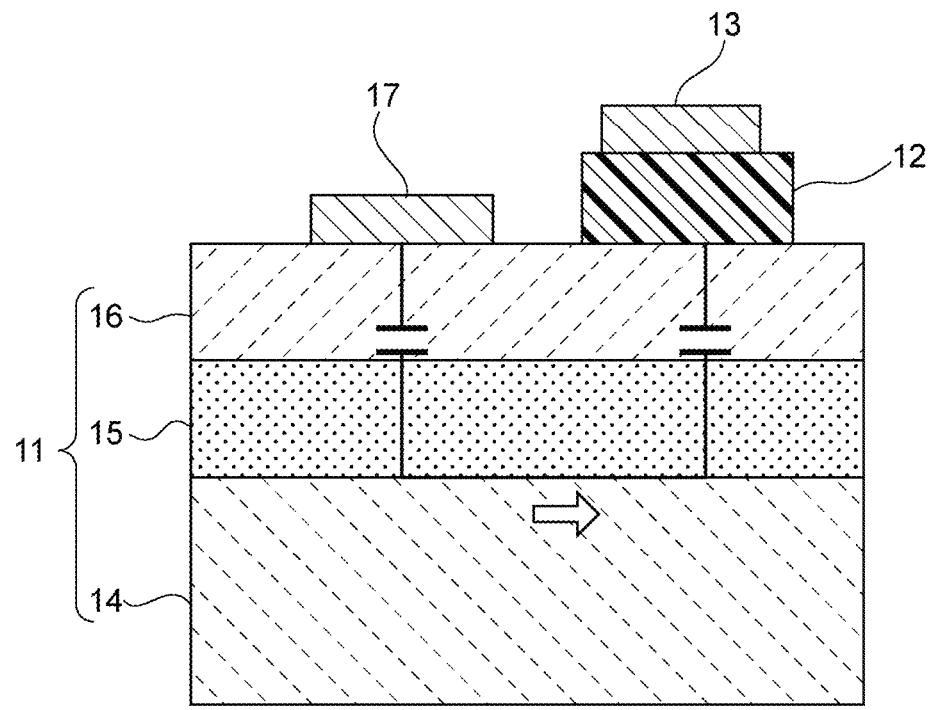
FIG. 5 is a front cross-sectional view showing a portion where a routing line is provided in the multiplexer according to the first preferred embodiment of the present invention.

On the other hand, in the present example, although a carrier is generated as indicated by an arrow illustrated in FIG. 5, the insulating film 12 is provided between the routing line 13 and the piezoelectric layer 16. Accordingly, the electrostatic capacitance between the routing line 13 and the conductive layer decreases, and it is thus conceivable that linearity is significantly improved and the second-order intermodulation distortion is decreased.

Incidentally, the first acoustic wave filter 5 is preferably a WiFi filter, for example, but may be another band pass filter. For example, a GPS filter may be used that passes a GPS signal and attenuates a signal in another cellular band.

Furthermore, the multiplexer 1 is a preferred embodiment of a composite filter device according to the present invention, and the first acoustic wave filter 5 or the second acoustic wave filter 7 included in the multiplexer 1 is also a preferred embodiment of an acoustic wave filter device according to the present invention. Specifically, the first acoustic wave filter 5 and the second acoustic wave filter 7 include the routing line electrically connected to the antenna terminal 3 and the insulating film 12 located between the routing line 13 and the piezoelectric layer 16. Thus, in the first acoustic wave filter 5 and the second acoustic wave filter 7, linearity is enhanced. Accordingly, as a result, in the multiplexer 1, distortion in a signal is reduced as described above.

Furthermore, the composite filter devices according to preferred embodiments of the present invention can be used for various multiplexers or composite filter devices in which three or more band pass filters share a common electrical connection, and a pass band thereof is not limited.

Figure 7:
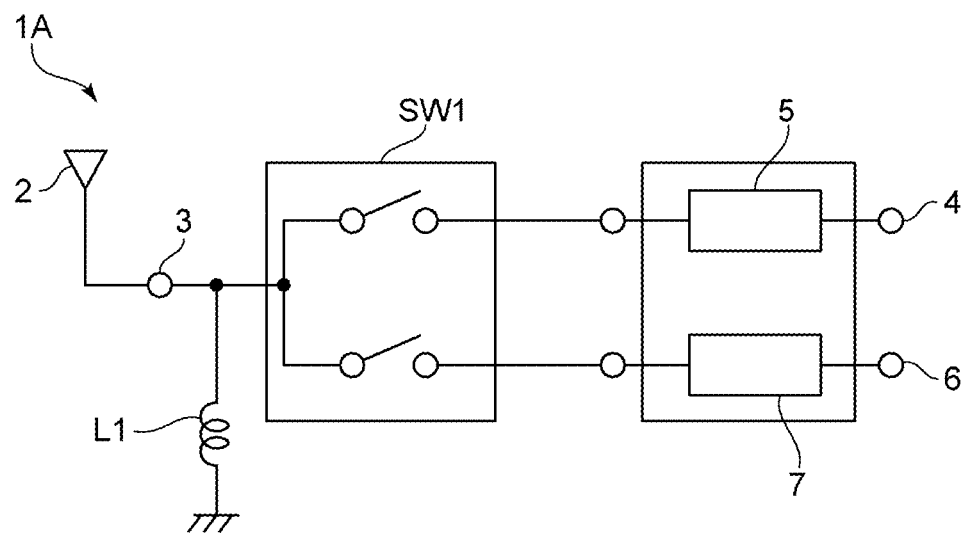
FIG. 7 is a circuit diagram showing a modification of a composite filter device according to a preferred embodiment of the present invention.

FIG. 7 is a circuit diagram illustrating a modification of a composite filter device according to a preferred embodiments of the present invention. In a composite filter device 1A, the first and second acoustic wave filters 5 and 7 defining and functioning as a plurality of acoustic wave filter devices share a common electrical connection, through a switch SW1, to the antenna terminal 3 electrically connected to the antenna 2. At least one of the first and second acoustic wave filters 5 and 7 sharing the common electrically connection through the switch SW1 may be an acoustic wave filter according to a preferred embodiment of the present invention.

Figure 8:
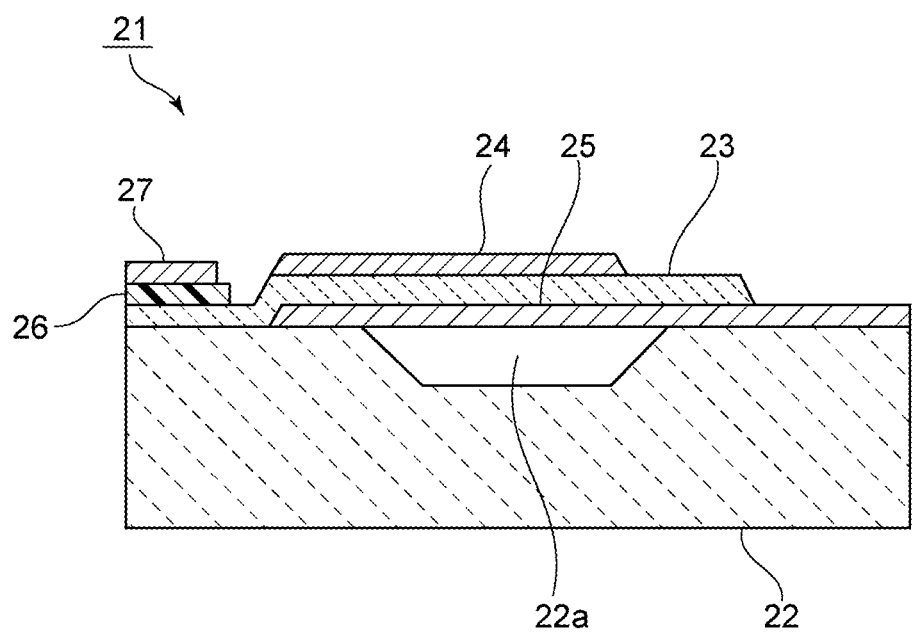
FIG. 8 is a front cross-sectional view showing an acoustic wave resonator section included in an acoustic wave filter device according to a second preferred embodiment of the present invention.

FIG. 8 is a front cross-sectional view illustrating an acoustic wave resonator section of an acoustic wave filter device included in a composite filter device according to a second preferred embodiment of the present invention.

Circuitry of the composite filter device according to the second preferred embodiment is the same or substantially the same as that in the first preferred embodiment. Thus, the details described with reference to FIG. 1 are referred to in a description of the second preferred embodiment.

A difference between the second preferred embodiment and the first preferred embodiment is in a physical structure in which an acoustic wave resonator and a routing line are put together. In an acoustic wave resonator 21 illustrated in FIG. 8, a recessed portion 22a is provided on an upper surface of a substrate 22 including a semiconductor.

On the substrate 22, a piezoelectric layer 23 is provided. The piezoelectric layer 23 includes first and second major surfaces facing each other. On the first major surface and the second major surface of the piezoelectric layer 23, first and second electrodes 24 and 25 face each other with the piezoelectric layer 23 interposed therebetween. A portion where the first electrode 24 and the second electrode 25 faces each other is located above the recessed portion 22a.

Meanwhile, a routing line 27 is electrically connected to the first electrode 24 at a portion, which is not illustrated, and is electrically connected to the antenna terminal, which is not illustrated. On a lower surface of the routing line 27, an insulating film 26 is provided. That is, the routing line 27 is not directly provided on the piezoelectric layer 23.

Thus, in the case where the acoustic wave resonator 21 is provided, when the insulating film 26 is provided between the routing line 27 and the piezoelectric layer 23, linearity can be improved as in the first preferred embodiment. Therefore, in the composite filter device according to the second preferred embodiment, the acoustic wave filter device including the acoustic wave resonator having the above-described insulating film 26 is included, and second-order intermodulation distortion can thus be reduced.

Incidentally, when the insulating film 26 provided between the routing line 27 and the piezoelectric layer 23 is provided at a location where the insulating film 26 overlaps the IDT electrode 17 when viewed in plan, the excitation of an acoustic wave is affected, thus deteriorating characteristics of the acoustic wave resonator. Thus, the insulating film 26 provided between the routing line 27 and the piezoelectric layer 23 is preferably provided, for example, at a location where the insulating film 26 does not overlap the IDT electrode 17 when viewed in plan.

Figure 9:
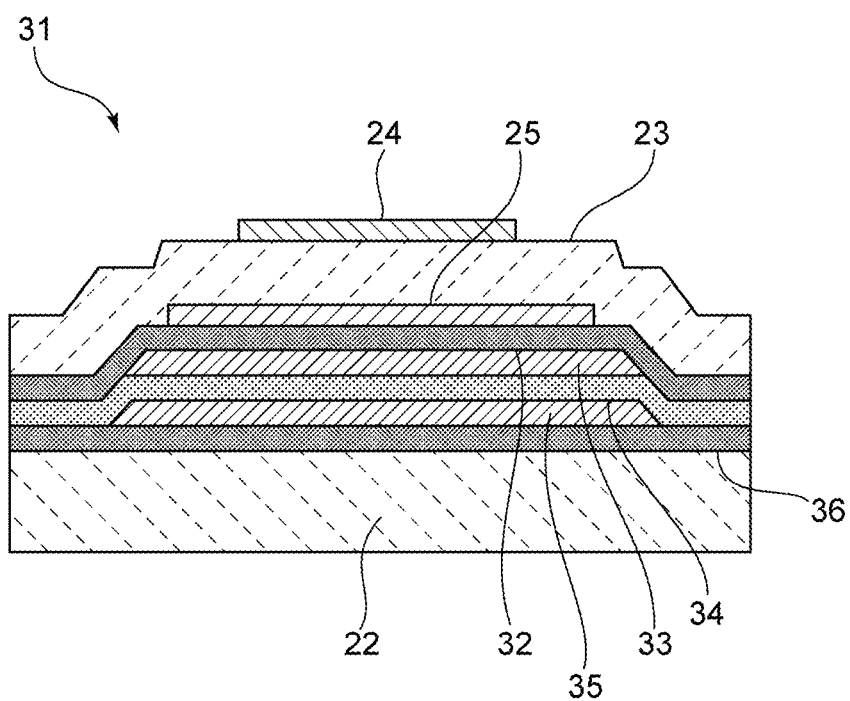
FIG. 9 is a front cross-sectional view showing a modification of an acoustic wave resonator of an acoustic wave filter device according to a preferred embodiment of the present invention.

Incidentally, the structure of the acoustic wave resonators according to the preferred embodiments of the present invention is not limited to a particular structure, and an acoustic wave resonator 31 in a modification illustrated in FIG. 9 may be used. The acoustic wave resonator 31 has, on the substrate 22 including a semiconductor, a structure in which low acoustic impedance layers 32, 34, and 36 having a relatively low acoustic impedance are stacked alternately with high acoustic impedance layers 33 and 35 having a relatively high acoustic impedance. On an acoustic multilayer film having this laminated structure, the piezoelectric layer 23, and the first and second electrodes 24 and 25 are stacked. That is, the acoustic wave resonator 31 may be included in which the acoustic multilayer film is used in place of the recessed portion 22a illustrated in FIG. 8.

Although, in the first preferred embodiment, a silicon oxide film is used as the low-acoustic-velocity film 15, an insulating material, for example, SiON, may be used.

Furthermore, a semiconductor of the substrate 14 is not limited to Si, and another semiconductor, for example, AsGa, may be used. In the first preferred embodiment, however, an acoustic velocity of a bulk wave propagating through the substrate 14 has to be higher than an acoustic velocity of an acoustic wave propagating through the piezoelectric layer 16.

Furthermore, with respect to materials of the insulating films 12 and 26, appropriate insulating materials can be used. As such an insulating material, for example, a synthetic resin can be suitably used due to relatively simple film formation. Such a synthetic resin is not limited to a particular synthetic resin, and, for example, a photosensitive polyimide or the like can be used.

Furthermore, the materials of the insulating films 12 and 26 are not limited to a synthetic resin, and the insulating films 12 and 26 may be films including an inorganic insulating material, for example, $SiO_2$.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
   an antenna terminal electrically connected to an antenna;
   an input or output terminal; and
   an acoustic wave filter electrically connected between the antenna terminal and the input or output terminal and including a plurality of acoustic wave resonators; wherein
   the plurality of acoustic wave resonators include a piezoelectric layer, an IDT electrode provided on the piezoelectric layer, a low-acoustic-velocity film in which an acoustic velocity of a bulk wave propagating through the low-acoustic-velocity film is lower than an acoustic velocity of an acoustic wave propagating through the piezoelectric layer, and a substrate in which an acoustic velocity of a bulk wave propagating through the substrate is higher than an acoustic velocity of an acoustic wave propagating through the piezoelectric layer and that includes a semiconductor; and
   the piezoelectric layer is provided on the substrate with the low-acoustic-velocity film interposed between the piezoelectric layer and the substrate, and, above the piezoelectric layer, a routing line electrically connected to the antenna terminal is provided on an insulating film provided on the piezoelectric layer.

2. The acoustic wave filter device according to claim 1, wherein the substrate is a silicon substrate.

3. The acoustic wave filter device according to claim 1, wherein the insulating film is made of a synthetic resin.

4. The acoustic wave filter device according to claim 1, wherein the insulating film is made of an inorganic insulating material.

5. A composite filter device comprising:
   the acoustic wave filter device according to claim 1; and
   at least one other acoustic wave filter device sharing a common electrical connection to the antenna terminal.

6. The composite filter device according to claim 5, wherein the composite filter device is a multiplexer.

7. A composite filter device, comprising:
   a plurality of acoustic wave filter devices sharing a common electrical connection to the antenna terminal through a switch; and
   at least one acoustic wave filter device of the plurality of acoustic wave filter devices is the acoustic wave filter device according to claim 1.

8. The acoustic wave filter device according to claim 1, wherein a plurality of series-arm resonators are provided in a series arm that electrically connects the antenna terminal and the input or output terminal.

9. The acoustic wave filter device according to claim 8, wherein a parallel-arm resonator is electrically connected between a ground terminal and a connection point between two of the plurality series-arm resonators.

10. The acoustic wave filter device according to claim 1, wherein the acoustic wave filter is a ladder filter.

11. The acoustic wave filter device according to claim 1, wherein the acoustic wave filter is a notch filter.

12. An acoustic wave filter device comprising:
an antenna terminal electrically connected to an antenna;
an input or output terminal; and
an acoustic wave filter electrically connected between the antenna terminal and the input or output terminal and including a plurality of acoustic wave resonators; wherein
the acoustic wave resonators each include a substrate made of a semiconductor, a piezoelectric layer provided on the substrate made of the semiconductor and including first and second major surfaces facing each other;
a first electrode is provided on the first major surface of the piezoelectric layer, and a second electrode is provided on the second major surface of the piezoelectric layer and facing the first electrode with the piezoelectric layer interposed between the second electrode and the first electrode; and
the acoustic wave filter device further includes an insulating film provided on the piezoelectric layer, and a routing line provided on the insulating film and electrically connected to the antenna terminal.

13. The acoustic wave filter device according to claim 12, wherein the substrate is a silicon substrate.

14. A composite filter device, comprising:
a plurality of acoustic wave filter devices sharing a common electrical connection to the antenna terminal through a switch; and
at least one acoustic wave filter device of the plurality of acoustic wave filter devices is the acoustic wave filter device according to claim 12.

15. The composite filter device according to claim 14, wherein
the plurality of acoustic wave filter devices include a first acoustic wave filter and a second acoustic wave filter, and
a pass band of the first acoustic wave filter is different from a pass band of the second acoustic wave filter.

16. The acoustic wave filter device according to claim 12, wherein the insulating film is made of a synthetic resin.

17. The acoustic wave filter device according to claim 12, wherein the insulating film is made of an inorganic insulating material.

18. A composite filter device comprising:
the acoustic wave filter device according to claim 12; and
at least one other acoustic wave filter device sharing a common electrical connection to the antenna terminal.

19. The composite filter device according to claim 18, wherein the composite filter device is a multiplexer.

* * * * *